(12) United States Patent
Dunlea et al.

(10) Patent No.: US 6,771,095 B1
(45) Date of Patent: Aug. 3, 2004

(54) LEVEL TRANSLATING DIGITAL SWITCH

(75) Inventors: John Olan Dunlea, Limerick (IE); John P. Quill, Mallow (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/355,453

(22) Filed: Jan. 31, 2003

Related U.S. Application Data

(63) Continuation of application No. 10/302,064, filed on Nov. 22, 2002, now abandoned.

(51) Int. Cl.[7] .................................................. H03K 19/175
(52) U.S. Cl. ............................. 326/86; 326/62; 326/21; 327/535; 327/333
(58) Field of Search ........................... 326/62, 63, 68, 326/80; 327/333, 535, 537

(56) References Cited

U.S. PATENT DOCUMENTS

| | | | | |
|---|---|---|---|---|
| 5,084,637 A | * | 1/1992 | Gregor | ........................ 326/81 |
| 5,382,846 A | * | 1/1995 | Shigehara et al. | ............. 326/68 |
| 5,689,196 A | * | 11/1997 | Schutte | ......................... 326/86 |
| 5,966,044 A | * | 10/1999 | Naka | .......................... 327/535 |

* cited by examiner

Primary Examiner—Vibol Tan
(74) Attorney, Agent, or Firm—Wolf, Greenfield & Sacks, P.C.

(57) ABSTRACT

A level translating digital switch in which a switching element provides switching and level translation between a first system and a second system that operate using different logic supply voltages. In a situation where the supply voltage for the first system is larger than the supply voltage for the second system, the switching element is driven by a voltage lower than the logic supply voltage of the first system. In one form of the invention, a level translating digital switch comprises a switching element that provides a bi-directional signal path between a first system operating with a first logic supply voltage and a second system operating with a second logic supply voltage, a driver circuit including a voltage selection portion that generates a secondary supply voltage that is less than the first logic supply voltage, and a control portion powered by the secondary supply voltage, the control portion generating a control voltage for the switching element, wherein the control voltage is less than the first logic supply voltage.

27 Claims, 4 Drawing Sheets

LEVEL TRANSLATING DIGITAL SWITCH

CROSS-REFERENCE TO RELATED APPLICATION

This application is a continuation of U.S. patent application Ser. No. 10/302,064 entitled LEVEL TRANSLATING DIGITAL SWITCH, filed Nov. 22, 2002 now Abandoned.

FIELD OF THE INVENTION

This invention relates generally to digital logic level translation and in particular to digital switching and logic level translation between one circuit having a first logic supply and another circuit having a different logic supply.

BACKGROUND OF THE INVENTION

Networks of bidirectional switches are often used to isolate or connect a particular port for parallel data interface. A switch of this type may also be used to isolate or connect a solitary data line. Devices of this type are often termed "bus switches," especially when multiple switches are used in parallel. Not only are bus switches useful for isolating a particular device, but they may also be employed when more than one device is sharing a particular bus connection. In a configuration of this kind, bus switches can be used to create a multi-port memory, for example.

Other common applications for bus switches include live insertion (hot plug) applications. A desirable feature of the bus switch components in an application like this is that the bus switches should not interfere with bus signals, nor should the bus switch itself incur any damage. One can also envision a device of this type being used as a multiplexer or demultiplexer, where there are multiple inputs for a single output (or vice versa).

In addition, since there is more and more mixed logic level circuitry available, a bus switch is a convenient and inexpensive way to perform a logic level translation between a system utilizing a first logic supply and a second system operating with a second logic supply. As is known in the art, a high-speed, bidirectional switch having a low ON resistance can be provided by a single NMOS transistor. A single, series-connected NMOS bus switch will level-translate an input voltage level to an output voltage level that is determined by the gate voltage of the NMOS transistor minus its threshold voltage.

A circuit of this type works well when performing a level translation between 3.3V and 2.5V, or between 2.5V and 1.8V, where the supply voltage is 3.3V or 2.5V respectively. In the examples given above, the output voltage will be approximately one Vtn (NMOS transistor threshold voltage) below the first logic supply voltage, which is approximately equal to the second logic supply voltage. One must consider that using a single NMOS structure will result in clamping at the output, provided the input voltage is greater than the gate voltage minus the NMOS threshold voltage (Vgate−Vtn).

It may be desirable to connect an analog-to-digital converter (ADC) operating with a supply voltage of 3.3 volts to a digital signal processor (DSP) utilizing a 1.8 volt supply. A level translation network would allow the two devices to interface even though they are operating with different logic supplies. Failure to employ a proper level translation may subject the inputs of the DSP to voltage overstress and possible damage.

One must take into account, though, that when performing a translation between 3.3V and 1.8V, this series-connected NMOS transistor can no longer provide the desired interface between the two disparate supply voltages. Accordingly, a need arises for a level translating bus switch that can provide logic level translation even when the difference between logic supplies exceeds a particular threshold voltage, such as, for example, a single step of logic supply voltages. The desired level translating switch should be simple to construct using the latest integrated circuit processes, but should exhibit a relatively small component count, occupy minimal die area, and be conservative of power supply current.

SUMMARY OF THE INVENTION

These needs and others are satisfied by the level-translating digital switch of the present invention, in which an NMOS transistor provides switching and level translation between a first system and a second system that operate using different logic supply voltages. In a situation where the supply voltage for the first system is larger than the supply voltage for the second system, the gate of the NMOS transistor is driven by a voltage lower than the logic supply voltage of the first system.

In accordance with one aspect of the present invention, an improved digital switch includes a switching element that provides a bi-directional signal path between a first system operating with a first logic supply voltage and a second system operating with a second logic supply voltage. The improvement comprises a driver circuit providing a control voltage for the switching element, wherein the control voltage is less than the first logic supply voltage. Preferably, the switching element comprises an NMOS transistor, and the second logic supply voltage is lower in amplitude than the first logic supply voltage.

In one form of the invention, the driver circuit comprises a voltage selection portion that generates a secondary supply voltage that is less than the first logic supply voltage, and a control portion powered by the secondary supply voltage, the control portion generating a control voltage for the switching element. The voltage selection portion preferably comprises an NMOS transistor having its drain coupled to a digital switch supply voltage, and providing a secondary supply voltage at its source that is approximately one NMOS threshold voltage below the digital switch supply voltage.

In another form of the invention, the control portion comprises logic powered at least in part by the secondary supply voltage, such that the control voltage at the logic output toggles between the secondary supply voltage and a digital switch supply reference potential in response to a switch control input signal. Preferably, the logic powered at least in part by the secondary supply voltage comprises at least one inverter. In general, the digital switch supply reference potential is ground, but it may be a negative supply voltage when the control portion is configured for split supply operation.

In yet another form of the invention, the NMOS transistor drain may be coupled to the digital switch supply voltage and the NMOS transistor gate may be coupled to a voltage distinct from the digital switch supply voltage. Preferably, the voltage distinct from the digital switch supply voltage and coupled to the NMOS transistor gate is relatively independent of variations in temperature and variations in amplitude of the digital switch supply voltage.

The improved digital switch may further comprise a selection logic portion that selects between a secondary supply voltage approximately equal to the digital switch supply voltage and a secondary supply voltage that is approximately one NMOS threshold voltage less than the digital switch supply voltage in response to a selection logic control input signal.

Preferably, the selection logic portion selects a first level translation mode in response to a first selection logic control input wherein the switching element performs level translation between a first system having a logic supply voltage Vcc1 and a second system having a logic supply voltage Vcc2 that is approximately equal to Vcc1−Vtn, and the selection logic portion selects a second level translation mode in response to a second selection logic control input wherein the switching element performs level translation between a first system having a logic supply voltage Vcc1 and a second system having a logic supply voltage Vcc2 that is approximately equal to Vcc1−2*Vtn, where Vtn is approximately equal to an NMOS transistor threshold voltage.

In accordance with another aspect of the present invention, a level translating digital switch comprises a switching element that provides a bi-directional signal path between a first system operating with a first logic supply voltage and a second system operating with a second logic supply voltage, a driver circuit including a voltage selection portion comprising an NMOS transistor having its drain coupled to a digital switch supply voltage, and providing a secondary supply voltage at its source that is approximately one NMOS threshold voltage below the digital switch supply voltage, and a control portion comprising logic powered at least in part by the secondary supply voltage, the control portion generating a control voltage for the switching element, wherein the control voltage toggles between the secondary supply voltage and a digital switch supply reference potential in response to a switch control input is signal.

In accordance with yet another aspect of the present invention, a level translating digital switch comprises an NMOS transistor switching element that provides a bi-directional signal path between a first system operating with a first logic supply voltage and a second system operating with a second logic supply voltage, a driver circuit including a voltage selection portion comprising an NMOS transistor having its drain coupled to a digital switch supply voltage, and providing a secondary supply voltage at its source that is approximately one NMOS threshold voltage below the digital switch supply voltage, a control portion comprising logic powered at least in part by the secondary supply voltage, the control portion generating a control voltage for the switching element, wherein the control voltage toggles between the secondary supply voltage and a digital switch supply reference potential in response to a switch control input signal, and a selection logic portion that selects between a secondary supply voltage approximately equal to the digital switch supply voltage and a secondary supply voltage that is approximately one NMOS threshold voltage less than the digital switch supply voltage in response to a selection logic control input signal.

Further objects, features, and advantages of the present invention will become apparent from the following description and drawings.

DETAILED DESCRIPTION OF THE INVENTION

Figure 1:
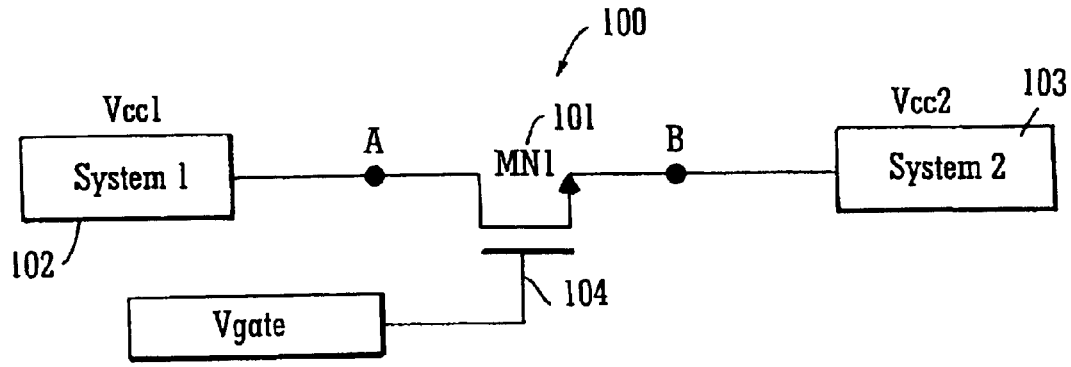
FIG. 1 illustrates a level translating digital switch of the prior art.

There is described herein a level translating digital switch that offers distinct advantages when compared to the prior art. FIG. 1 illustrates a level translating digital switch of the prior art, generally depicted by the numeral 100. Using this prior art circuit 100, a single NMOS bus switch MN1 101 provides an output voltage that follows the input voltage up to the value of Vgate−Vtn. As the input voltage increases further, the output voltage is clamped at Vgate−Vtn.

As shown in FIG. 1, the input voltage at node A is Vcc1, which is the logic supply voltage for System 1 102. Since Vgate is equal to the logic supply voltage for System 1 102, the output voltage at node B (the supply voltage for System 2 103) can be computed by subtracting the NMOS threshold voltage of about 0.8 volts from the Vcc1 voltage. This circuit 100 works satisfactorily when performing a level translation between 3.3V and 2.5V, or between 2.5V and 1.8V, where the supply voltage (Vcc) is 3.3V or 2.5V respectively, but the circuit 100 is not sufficient when the necessary level translation is no longer about Vtn, but instead is approximately 2*Vtn.

Figure 2:
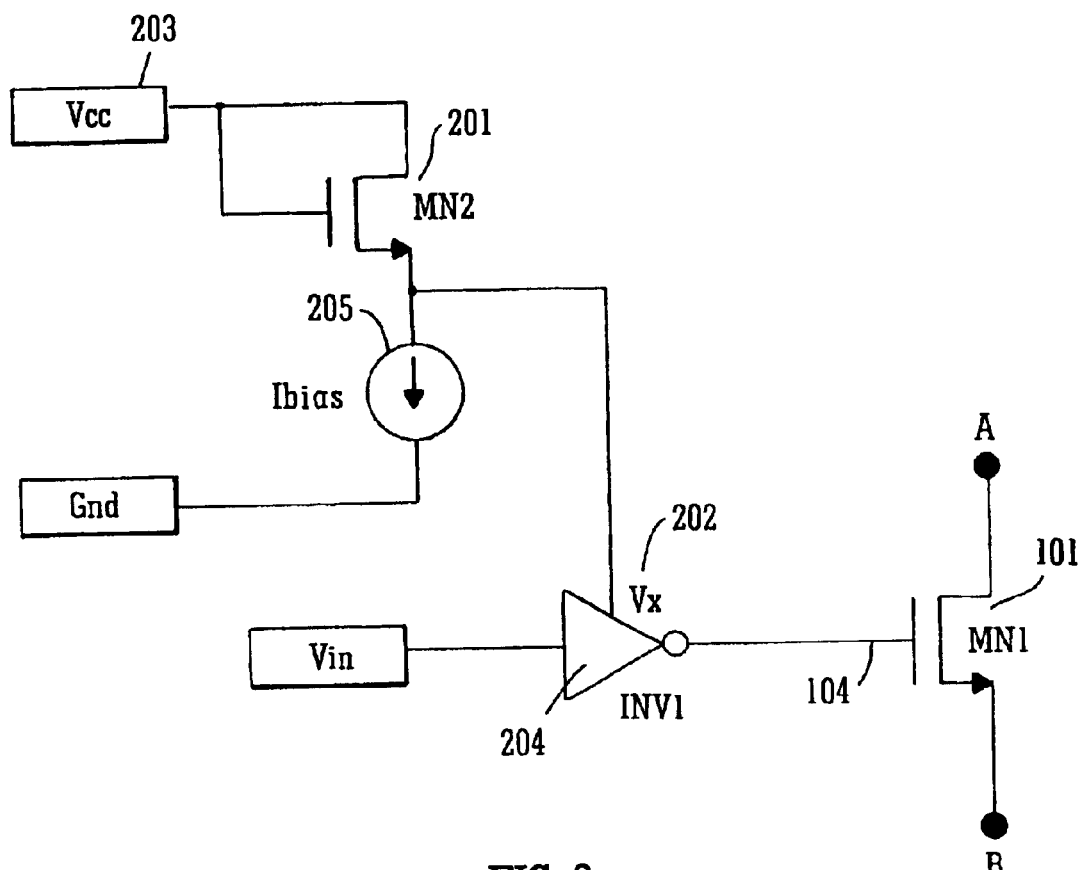
FIG. 2 depicts one embodiment of a level translating digital switch in accordance with the present invention.

When performing a level translation between 3.3V and 1.8V, with a supply voltage of 3.3V, it is necessary to generate a lower voltage than Vcc to drive the gate of the NMOS MN1, in order to achieve the required level translation between A and B. FIG. 2 illustrates the use of a second NMOS transistor MN2 201 to generate a secondary supply voltage Vx 202 that is one NMOS threshold voltage below Vcc 203. The voltage Vcc 203 could be termed the digital switch supply voltage. Vx 202 is used as the positive supply voltage for inverter INV1 204. Of course, for proper operation, NMOS transistor MN2 201 requires proper stable biasing, and this is provided by current source 205 with a value of Ibias. In practice, this current source 205 would be provided by a current mirror circuit, which is well-known in the art.

When NMOS transistor MN1 101 is ON, the output of INV1 204 will be Vx 202, and this voltage Vx 202 drives the gate 104 of transistor MN 1101. This allows voltage translation between nodes A and B, with node B having a maximum voltage of Vx 202 minus one NMOS threshold voltage, or Vtn. The voltage at node B is, in effect, 2*Vtn below Vcc 203. This configuration allows 3.3V to 1.8V logic level translation. Nodes A and B are interchangeable, which makes the circuit of FIG. 2 bidirectional.

Figure 3:
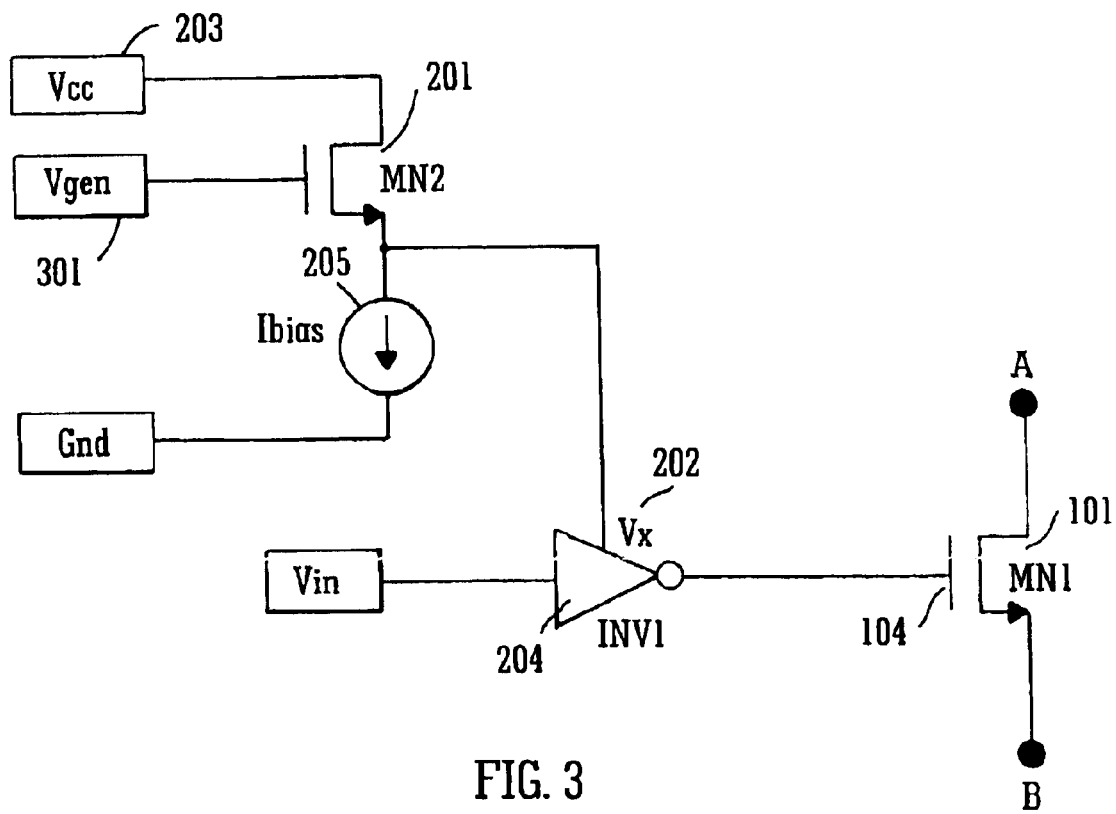
FIG. 3 is an alternative embodiment of a level translating digital switch in accordance with the present invention.

In the circuit of FIG. 3, an independent voltage Vgen 301 is applied to the gate of transistor MN2 201, and is designed to provide optimum performance under different power supply and temperature conditions. Vgen 301 is typically provided by a circuit that generates a fixed output voltage independent of variations in power supply voltage or temperature variations. For example, Vgen 301 may be provided by a standard voltage regulator or voltage reference IC. It is desirable to make Vgen 301 as independent of parameter variation as possible because a more stable voltage at the gate of MN2 201 results in a more stable Vx 20 202, which in turn will yield less variation in the voltage one sees at the output. In this context, of course, "more stable" means less dependent upon temperature and the digital switch supply voltage Vcc 203.

Figure 4:
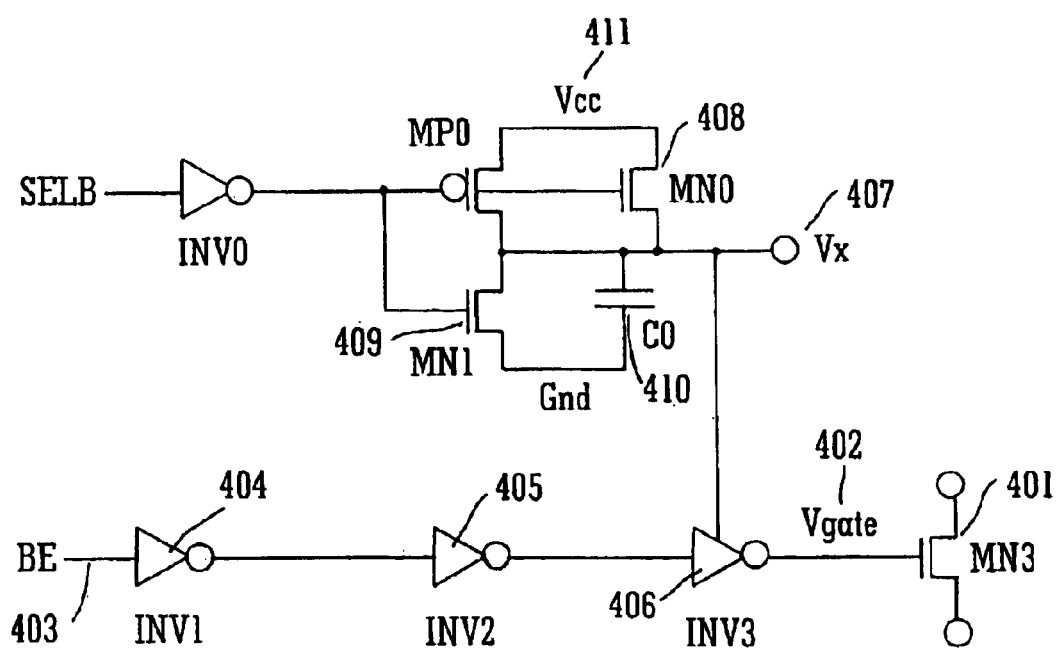
FIG. 4 is a schematic diagram of a network that performs digital switching and logic translation in accordance with the present invention.

FIG. 4 is a schematic diagram of a network that performs digital switching and logic translation in accordance with the present invention. MN3 401 is the switch that performs the actual level translation between nodes A and B. The Vgate voltage 402 determines the maximum output voltage one can obtain from the output of the network, specifically Vgate–Vtn. Of course, the threshold voltage Vtn in this case refers to the threshold voltage of the NMOS transistor MN3 401 that performs the actual switching.

A control input BE 403 determines whether transistor MN3 401 is ON or OFF. In this exemplary embodiment, the control signal BE 403 is passed through a chain of three inverters, INV1 404, INV2 405, and INV3 406, although a different number of inverters could be used. In fact, the logic through which the control input signal BE 403 propagates could be constructed using other logic elements, such as AND gates and OR gates, for example, as is well-known in the art.

In the preferred embodiment of the invention, INV3 406 occupies a larger die area than INV2 405, and INV2 405 is larger than INV1 404. This progressive increase in size results in INV3 406 being an inverter large enough to drive the gate of the large NMOS transistor MN3 401. Inverter INV3 406 is powered from a voltage that is generated on-chip (i.e., Vx 407). It should be noted that this progressive size increase of the inverters is simply a customary design practice, and is not required for the invention to function satisfactorily.

Although it is clear that inverter INV3 406 toggles between Vx 407 and ground in response to control input signal BE 403, the inverters or other logic through which the control input signal BE 403 propagates could also be configured for split power supply operation. In this event, since the control portion of the circuit would now be powered by secondary supply voltage Vx 407 and a negative supply voltage Vss (not shown in FIG. 4), the output of the inverter INV3 406 (or other device selected to drive the gate of NMOS transistor MN3 401) would toggle between Vx and Vss in response to control input signal BE 403. As a general principle, one may say that inverter INV3 406 toggles between the secondary supply voltage and a digital switch supply reference potential. For single supply operation, this digital switch supply reference potential is ground. For split supply operation, the digital switch supply reference potential is a negative supply voltage.

Transistors MN0 408 and MN1 409, along with capacitor C0 410, are used to generate Vx 407. SELB (701 in FIG. 7) controls whether MN0 408 and MN1 409, or MP0 (703 in FIG. 7) are ON, as will be explained in detail below. MN1 409 is a very small device, in terms of channel size, that sets a bias current through MN0 408. MN0 408 then clamps the voltage Vx 407 at Vcc–Vtn, and this voltage Vx 407 is then used as a supply for INV3 406. Since INV3 406 is a standard inverter, the output of INV3 406, which corresponds to Vgate 402, toggles between zero volts and Vx 407 depending upon the control voltage input BE 403. Thus, a method is provided for varying the voltage Vgate 402 at the gate of MN3 401. The voltage Vx 407 could be used as the supply for the other inverters as well, and it could also be used to power other circuitry.

Figure 7:
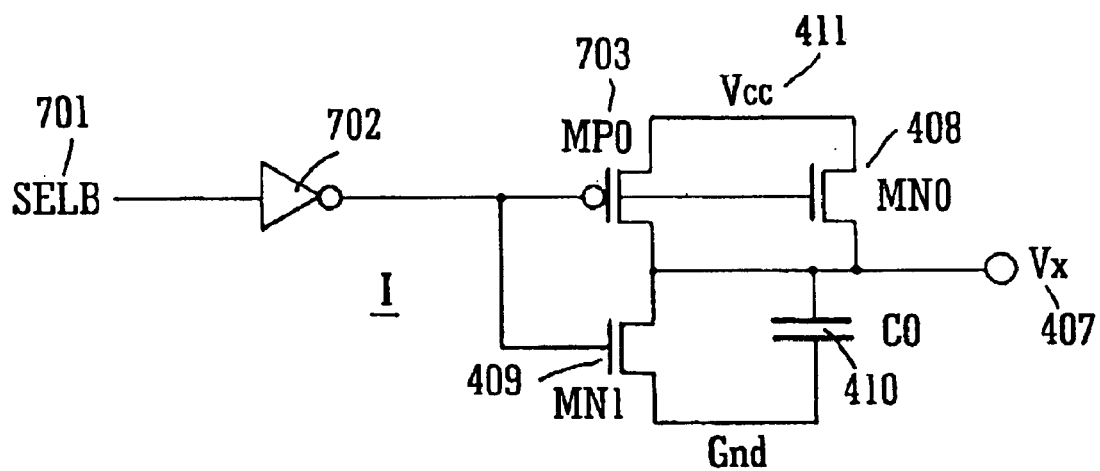
FIG. 7 illustrates the selection logic portion of the network of FIG. 4.

FIG. 7 illustrates the selection logic portion of the network of FIG. 4. Digital input signal SELB 701 determines whether the network of FIG. 4 will perform a 3.3V to 2.5V translation, or a 3.3V to 1.8V translation (assuming a 3.3V supply voltage). When SELB 701 is in a HIGH logic state, the network of FIG. 4 is configured to perform a 3.3V to 2.5V translation. When SELB 701 is in a LOW logic state, the network of FIG. 4 performs a 3.3V to 1.8V translation.

When SELB 701 is HIGH, transistor MP0 703 is ON. This means that Vx 407 is tied to Vcc 411 through transistor MP0 703. With a gate-to-source voltage Vgs of–Vcc, MP0 703 is fully ON. Since MP0 703 is deliberately constructed to have a large channel area, the voltage drop across it will be small. This means that Vx 407 will be approximately equal to Vcc, and this is the supply voltage that is applied to INV3 (406 in FIG. 4).

On the other hand, when SELB 701 is in a LOW logic state, both MN0 408 and MN1 409 turn ON. MN1 409 is used to set up a bias current through MN0 408. Vx 407 is then set to Vcc–Vtn0 (the threshold voltage of MN0 408). This is because of the level translation action of MN0 408. This voltage Vx 407, at Vcc–Vtn0, is then the voltage that is used as the supply for INV3 (406 in FIG. 4).

MN1 409 is only setting up a bias current so that MN0 408 has a known Ids (drain-source current) through it. This bias current could be generated using a resistor or a current source, for example. C0 410 is a large capacitor used to hold Vx 407 as stable as possible during switching, when transient currents can be large. During these large switching currents, the voltage Vx 407 may vary, but C0 410 acts as a "tank" to keep it as stable as possible. Although it is preferred that capacitor C0 410 be included, the circuit will also work without C0 410.

Figure 6:
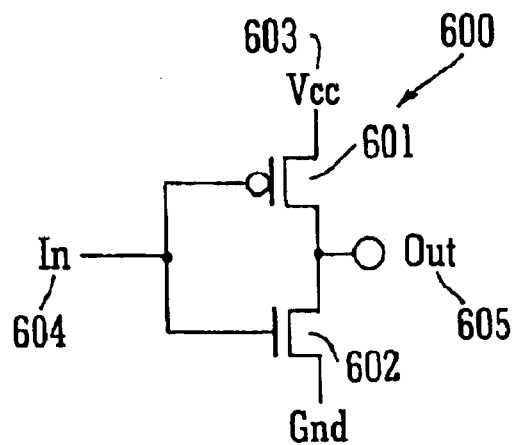
FIG. 6 is a schematic view of a typical CMOS inverter.

A schematic view of a typical inverter, such as inverters INV1 404, INV2 405, and INV3 406 is shown in FIG. 6, and generally depicted by the numeral 600. Each inverter features a p-channel MOSFET 601 coupled to a supply voltage 603, and coupled in turn to an n-channel MOSFET 602 to ground. The input signal 604 is coupled to the gates of both devices 601, 602, and the output signal 605 is derived from the junction of the drains of the two devices.

When a HIGH input signal 604 is applied, transistor 601 will be OFF and transistor 602 will be ON, yielding a logic low output signal near zero volts. Conversely, a LOW logic level appearing at the input 604 will turn ON transistor 601 and turn OFF transistor 602. Thus, the output voltage 605 will be a logic HIGH level signal nearly equal to the supply voltage 603.

Figure 5:
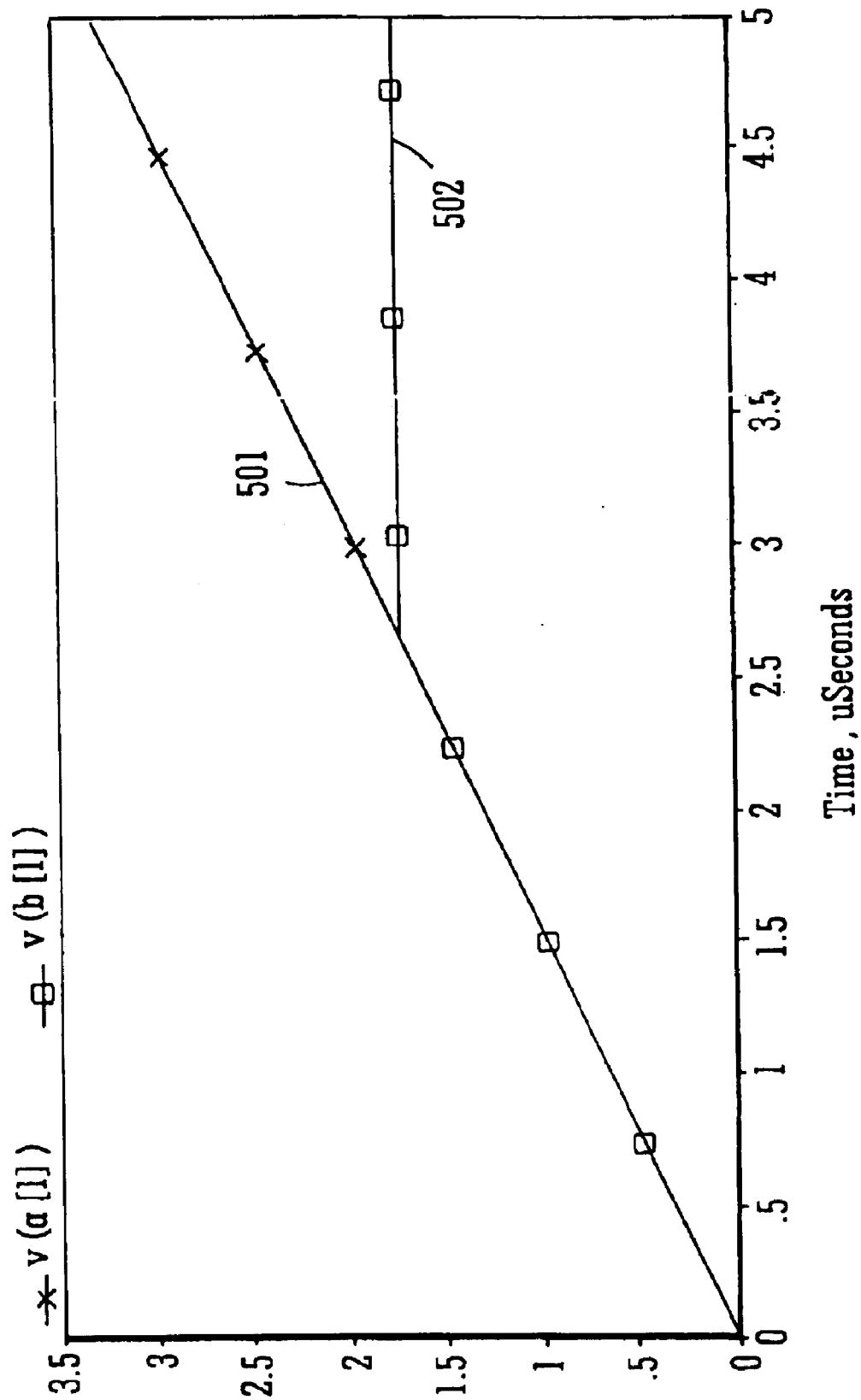
FIG. 5 is a plot illustrating how the output voltage of FIG. 4 is clamped as the input voltage increases.

The plot illustrated in FIG. 5 shows how the output voltage 502 (at node B of FIG. 4) is clamped at approximately 1.8 volts as the input voltage 501 (node A in FIG. 4) is ramped from zero volts to 3.3 volts. The simulation of the network of FIG. 4 that produced the plot of FIG. 5 was based upon nominal models for all circuit elements, Vcc equal to 3.3 volts, and a temperature of 25° C.

There has been described herein a level translating digital switch that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. An improved digital switch including a switching element that provides a bi-directional signal path between a first system operating with a first logic supply voltage and a second system operating with a second logic supply voltage, the improvement comprising:

a driver circuit providing a control voltage for the switching element, wherein the control voltage is less than the first logic supply voltage, said driver circuit further comprising a voltage selection portion that generates a secondary supply voltage that is less than the first logic supply voltage and a control portion powered by the secondary supply voltage, the control portion generating a control voltage for the switching element.

2. The improved digital switch of claim 1, wherein the second logic supply voltage is lower in amplitude than the first logic supply voltage.

3. The improved digital switch of claim 1, wherein the switching element comprises an NMOS transistor.

4. The improved digital switch of claim 1, wherein the voltage selection portion comprises an NMOS transistor having its drain coupled to a digital switch supply voltage, and providing a secondary supply voltage at its source that is approximately one NMOS threshold voltage below said digital switch supply voltage.

5. The improved digital switch of claim 4, wherein the control portion comprises logic powered at least in part by the secondary supply voltage, such that the control voltage at the logic output toggles between the secondary supply voltage and a digital switch supply reference potential in response to a switch control input signal.

6. The improved digital switch of claim 5, wherein said logic powered at least in part by the secondary supply voltage comprises at least one inverter.

7. The improved digital switch of claim 5, wherein the digital switch supply reference potential is ground.

8. The improved digital switch of claim 5, wherein the control portion is configured, at least in part, for split power supply operation, and the digital switch supply reference potential is a negative supply voltage.

9. The improved digital switch of claim 4, wherein the NMOS transistor drain is coupled to the digital switch supply voltage, and the NMOS transistor gate is coupled to a voltage distinct from said digital switch supply voltage.

10. The improved digital switch of claim 9, wherein said voltage distinct from said digital switch supply voltage and coupled to the NMOS transistor gate is relatively independent of variations in temperature and variations in amplitude of said digital switch supply voltage.

11. The improved digital switch of claim 4, further comprising a selection logic portion that selects between a secondary supply voltage approximately equal to said digital switch supply voltage and a secondary supply voltage that is approximately one NMOS threshold voltage less than said digital switch supply voltage in response to a selection logic control input signal.

12. The improved digital switch of claim 11, wherein the selection logic portion selects a first level translation mode in response to a first selection logic control input wherein the switching element performs level translation between a first system having a logic supply voltage Vcc1 and a second system having a logic supply voltage Vcc2 that is approximately equal to Vcc1−Vtn, and the selection logic portion selects a second level translation mode in response to a second selection logic control input wherein the switching element performs level translation between a first system having a logic supply voltage Vcc1 and a second system having a logic supply voltage Vcc2 that is approximately equal to Vcc1−2*Vtn, where Vtn is approximately equal to an NMOS transistor threshold voltage.

13. A level translating digital switch comprising:
a switching element that provides a bi-directional signal path between a first system operating with a first logic supply voltage and a second system operating with a second logic supply voltage; and
a driver circuit including:
a voltage selection portion comprising an NMOS transistor having its drain coupled to a digital switch supply voltage, and providing a secondary supply voltage at its source that is approximately one NMOS threshold voltage below said digital switch supply voltage; and
a control portion comprising logic powered at least in part by the secondary supply voltage, the control portion generating a control voltage for the switching element, wherein the control voltage toggles between the secondary supply voltage and a digital switch supply reference potential in response to a switch control input signal.

14. The level translating digital switch of claim 13, wherein the second logic supply voltage is lower in amplitude than the first logic supply voltage.

15. The level translating digital switch of claim 13, wherein the switching element comprises an NMOS transistor.

16. The level translating digital switch of claim 13, wherein said logic powered at least in part by the secondary supply voltage comprises at least one inverter.

17. The level translating digital switch of claim 13, wherein the digital switch supply reference potential is ground.

18. The level translating digital switch of claim 13, wherein the control portion is configured, at least in part, for split power supply operation, and the digital switch supply reference potential is a negative supply voltage.

19. The level translating digital switch of claim 13, wherein the NMOS transistor drain is coupled to the digital switch supply voltage, and the NMOS transistor gate is coupled to a voltage distinct from said digital switch supply voltage.

20. The level translating digital switch of claim 19, wherein said voltage distinct from said digital switch supply voltage and coupled to the NMOS transistor gate is relatively independent of variations in temperature and variations in amplitude of said digital switch supply voltage.

21. The level translating digital switch of claim 13, further comprising a selection logic portion that selects between a secondary supply voltage approximately equal to said digital switch supply voltage and a secondary supply voltage that is approximately one NMOS threshold voltage less than said digital switch supply voltage in response to a selection logic control input signal.

22. The level translating digital switch of claim 21, wherein the selection logic portion selects a first level translation mode in response to a first selection logic control input wherein the switching element performs level translation between a first system having a logic supply voltage Vcc1 and a second system having a logic supply voltage Vcc2 that is approximately equal to Vcc1−Vtn, and the selection logic portion selects a second level translation mode in response to a second selection logic control input wherein the switching element performs level translation between a first system having a logic supply voltage Vcc1 and a second system having a logic supply voltage Vcc2 that is approximately equal to Vcc1−2*Vtn, where Vtn is approximately equal to an NMOS transistor threshold voltage.

23. A level translating digital switch comprising:
an NMOS transistor switching element that provides a bi-directional signal path between a first system operating with a first logic supply voltage and a second system operating with a second logic supply voltage; and a driver circuit including:
- a voltage selection portion comprising an NMOS transistor having its drain coupled to a digital switch supply voltage, and providing a secondary supply voltage at its source that is approximately one NMOS threshold voltage below said digital switch supply voltage; and
- a control portion comprising logic powered at least in part by the secondary supply voltage, the control portion generating a control voltage for the switching element, wherein the control voltage toggles between the secondary supply voltage and a digital switch supply reference potential in response to a switch control input signal; and
- a selection logic portion that selects between a secondary supply voltage approximately equal to said digital switch supply voltage and a secondary supply voltage that is approximately one NMOS threshold voltage less than said digital switch supply voltage in response to a selection logic control input signal.

24. The level translating digital switch of claim 23, wherein the second logic supply voltage is lower in amplitude than the first logic supply voltage.

25. The level translating digital switch of clam 23, wherein the digital switch supply reference potential is ground.

26. The level translating digital switch of claim 23, wherein the control portion is configured, at least in part, for split power supply operation, and the digital switch supply reference potential is a negative supply voltage.

27. The level translating digital switch of claim 23, wherein the selection logic portion selects a first level translation mode in response to a first selection logic control input wherein the switching element performs level translation between a first system having a logic supply voltage Vcc1 and a second system having a logic supply voltage Vcc2 that is approximately equal to Vcc1−Vtn, and the selection logic portion selects a second level translation mode in response to a second selection logic control input wherein the switching element performs level translation between a first system having a logic supply voltage Vcc1 and a second system having a logic supply voltage Vcc2 that is approximately equal to Vcc1−2*Vtn, where Vtn is approximately equal to an NMOS transistor threshold voltage.

* * * * *